(12) United States Patent
Yamashiro et al.

(10) Patent No.: US 12,406,831 B2
(45) Date of Patent: Sep. 2, 2025

(54) PLASMA RESISTANT MEMBER, PLASMA TREATMENT DEVICE COMPONENT, AND PLASMA TREATMENT DEVICE

(71) Applicant: KYOCERA CORPORATION, Kyoto (JP)

(72) Inventors: Mamoru Yamashiro, Omihachiman (JP); Yoshinori Kubo, Omihachiman (JP); Keiji Yukihiro, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 482 days.

(21) Appl. No.: 17/778,717

(22) PCT Filed: Nov. 24, 2020

(86) PCT No.: PCT/JP2020/043670
§ 371 (c)(1),
(2) Date: May 20, 2022

(87) PCT Pub. No.: WO2021/106871
PCT Pub. Date: Jun. 3, 2021

(65) Prior Publication Data
US 2023/0019508 A1 Jan. 19, 2023

(30) Foreign Application Priority Data

Nov. 27, 2019 (JP) ................. 2019-214389

(51) Int. Cl.
*H01J 37/32* (2006.01)
*C04B 35/44* (2006.01)

(52) U.S. Cl.
CPC ........ *H01J 37/32495* (2013.01); *C04B 35/44* (2013.01); *H01J 37/3244* (2013.01);
(Continued)

(58) Field of Classification Search
CPC ............ H01J 37/32495; H01J 37/3244; H01J 37/32467; H01J 2237/332;
(Continued)

(56) References Cited

U.S. PATENT DOCUMENTS 5,851,284 A * 12/1998 Ishibashi ................. C30B 15/00
117/902
7,288,496 B2 * 10/2007 Kobayashi ............ C04B 35/581
219/548

(Continued)

FOREIGN PATENT DOCUMENTS

CN 104229857 B * 10/2016
DE 3905966 A1 8/1990
(Continued)

OTHER PUBLICATIONS

Grant-Jacob et al., "An 11.5 W Yb:YAG planar waveguide laser fabricated via pulsed laser deposition", accepted Nov. 30, 2015; published Dec. 10, 2015 Jan. 1, 20161 vol. 6, No. 11 DOI: 10.1364/0ME.6.0000911 Optical Materials Express, 6 pages.

*Primary Examiner* — Aiden Lee
(74) *Attorney, Agent, or Firm* — Procopio, Cory, Hargreaves & Savitch LLP

(57) ABSTRACT

The present disclosure relates to a plasma resistant member in which a surface exposed to plasma is formed from a single crystal yttrium•aluminum•garnet (YAG) having a {100} plane, and a plasma treatment device component and a plasma treatment device using the plasma resistant member. When there are a plurality of surfaces exposed to plasma, at least a surface required to have the highest plasma resistance is formed from the single crystal YAG having a {100} plane.

18 Claims, 6 Drawing Sheets

(52) U.S. Cl.
CPC ... *H01J 37/32467* (2013.01); *H01J 2237/332* (2013.01); *H01J 2237/334* (2013.01)

(58) Field of Classification Search
CPC ............... H01J 2237/334; C04B 35/44; C23C 16/4401; C23C 16/45563; C30B 15/34; C30B 29/28
See application file for complete search history.

(56) References Cited

U.S. PATENT DOCUMENTS

| | | | |
|---|---|---|---|
| 8,357,262 B2* | 1/2013 | Nakahara | C04B 35/63416 118/723 R |
| 8,383,236 B2* | 2/2013 | Mikaki | C04B 35/6455 428/404 |
| 9,790,596 B1 | 10/2017 | Kajiwara | |
| 2011/0073995 A1 | 3/2011 | Nomura et al. | |
| 2013/0277332 A1* | 10/2013 | Aheem | C23C 4/134 216/41 |
| 2019/0345069 A1* | 11/2019 | Kajino | C01F 17/259 |

FOREIGN PATENT DOCUMENTS

| | | | | |
|---|---|---|---|---|
| JP | H09-293774 A | 11/1997 | | |
| JP | H10-45461 A | 2/1998 | | |
| JP | 10236871 A | 9/1998 | | |
| JP | 5768159 B2 * | 8/2015 | ......... | H01L 21/0242 |
| WO | 2014/119177 A1 | 8/2014 | | |

* cited by examiner

PLASMA RESISTANT MEMBER, PLASMA TREATMENT DEVICE COMPONENT, AND PLASMA TREATMENT DEVICE

TECHNICAL FIELD

The present disclosure relates to a plasma resistant member, a plasma treatment device component, and a plasma treatment device, which are used in an environment exposed to plasma.

BACKGROUND ART

In the related art, a device for forming a thin film on a target by using plasma or a device for performing an etching process on the target is used in a semiconductor manufacturing process or the like. The plasma film forming device forms a thin film on the target by turning raw material gas into plasma and causing a chemical reaction. The plasma etching device etches the target by turning etching gas into plasma, chemically reacting the surface of the target with the plasma, and vaporizing the surface.

Various plasma treatment device components such as gas nozzles, windows, and substrate mounting components are used in reaction chambers of these plasma treatment devices. As materials for these plasma treatment device components, ceramic sintered bodies such as yttrium, yttrium•aluminum•garnet (YAG), and alumina are used (PTL 1).

When the surface of the plasma treatment device component reacts with highly reactive gas or plasma, particles may be generated from the surface. When the particles adhere to the target, since they may cause defects, the plasma treatment device component is required to have plasma resistance. Yttrium and YAG are known to have higher plasma resistance than alumina (Patent Documents 1 and 2).

In order to reduce defects caused by particles, a plasma resistant member having further excellent plasma resistance is required.

CITATION LIST

Patent Literature

Patent Document 1: WO 2014/119177
Patent Document 2: JP 10-45461 A

SUMMARY

The present disclosure relates to a plasma resistant member in which a surface exposed to plasma is formed from a single crystal yttrium•aluminum•garnet (YAG) having a {100} plane, and a plasma treatment device component and a plasma treatment device using the plasma resistant member.

The present disclosure relates to a plasma resistant member in which there are a plurality of surfaces exposed to plasma, at least a surface required to have the highest plasma resistance is formed from a single crystal YAG having a {100} plane, and a plasma treatment device component and a plasma treatment device using the plasma resistant member.

DESCRIPTION OF EMBODIMENTS

Hereinafter, an embodiment of the present disclosure will be described with reference to the drawings. The present disclosure provides a plasma resistant member, a plasma treatment device component, and a plasma treatment device, which have excellent plasma resistance and less generation of particles.

In the present specification, the plasma resistant member is a component that has corrosion resistance (hard to be etched) against plasma such as halogen-based gas.

The plasma resistant member is used for gas supply components such as injectors, gas nozzles, and shower heads; internal monitoring components such as windows; substrate holding components such as electrostatic chucks and carrier plates, protective components such as protective tubes for thermocouples, and the like in a plasma treatment device such as a plasma film forming device or a plasma etching device.

Figure 1:
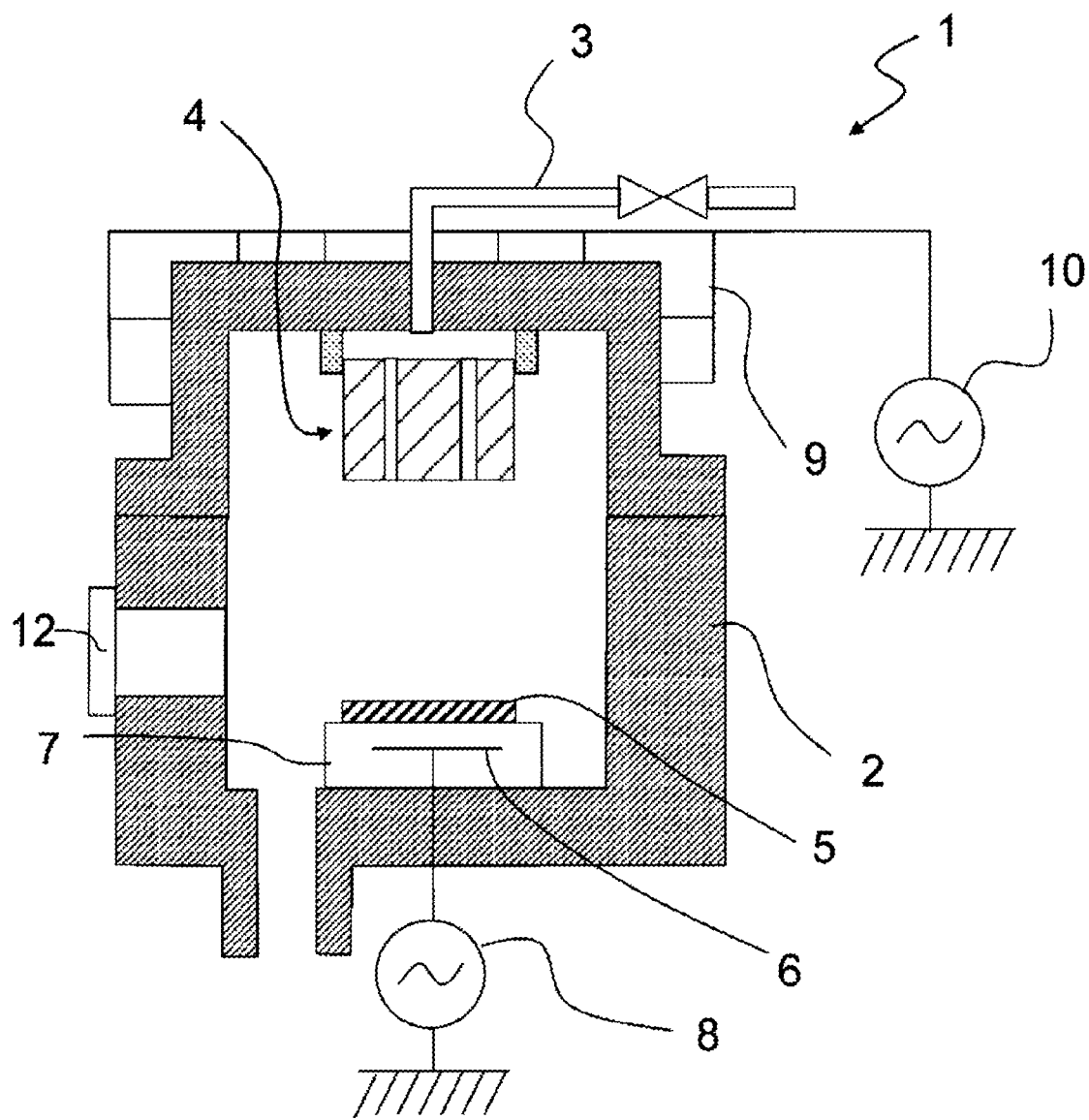
FIG. 1 is a schematic view of a plasma treatment device of the present disclosure.

FIG. 1 is a schematic cross-sectional view of a plasma treatment device using a plasma resistant member of the present disclosure. A plasma treatment device 1 is a device that forms a thin film on a target 5 such as a semiconductor wafer or a glass substrate or performs an etching process, thereby modifying the surface of the target 5.

The plasma treatment device 1 includes a reaction chamber 2 for processing the target 5. Inside the reaction chamber 2, a gas nozzle 4 for supplying gas into the reaction chamber 2; and a holding unit 6 provided with an internal electrode 7, such as an electrostatic chuck, are provided. Outside the reaction chamber 2, a gas supply pipe 3 for supplying raw material gas to the gas nozzle 4; a coil 9 and a power supply 10 for supplying electric power for generating plasma; and a bias power supply 8 connected to the internal electrode 7 are provided. Furthermore, the reaction chamber 2 includes a window 12 for observing the inside thereof.

The target 5 is placed on the holding unit 6, the gas is supplied into the reaction chamber 2 via the gas nozzle 4 and is turned into plasma by electric discharge by the electric power supplied from the coil 9 and the power supply 10, and the target 5 is processed.

For example, when a thin film made of silicon dioxide ($SiO_2$) is formed on the substrate 5, raw material gas such as silane ($SiH_4$) and oxygen ($O_2$) is supplied, and when the substrate 5 is etched, etching gas such as halogen-based gas such as $SF_6$, $CF_4$, $CHF_3$, $ClF_3$, $NF_3$, $C_3F_8$, $C_4F_8$, HF, $Cl_2$, HCl, $BCl_3$, or $CCl_4$ is supplied.

Figure 2A:
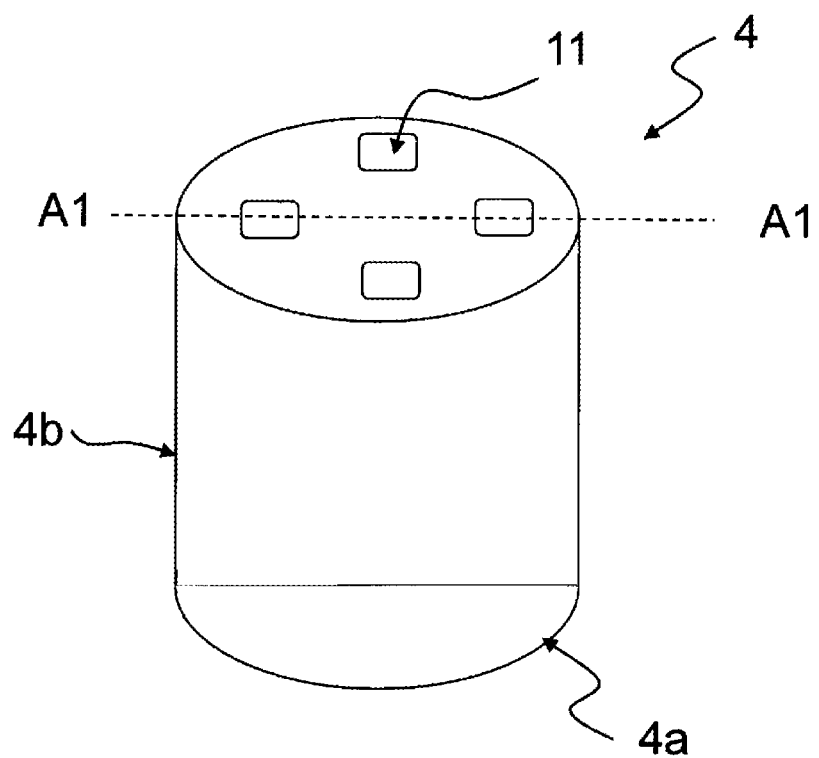
FIG. 2A is a schematic perspective view of a gas nozzle using a plasma resistant member of the present disclosure.
Figure 2B:
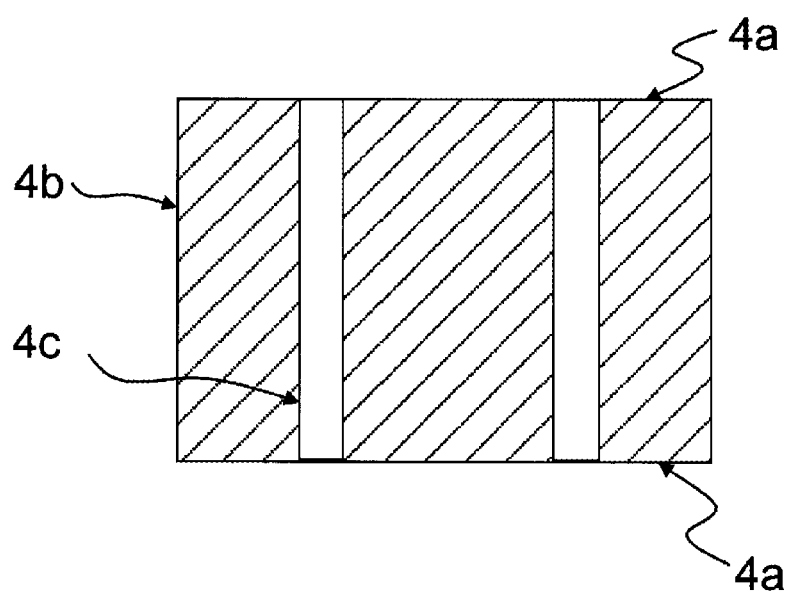
FIG. 2B is a cross-sectional view taken along a line A1-A1 in FIG. 2A.

FIGS. 2A and 2B are schematic views of a gas nozzle using the plasma resistant member of the present disclosure. FIG. 2A is a perspective view and FIG. 2B is a cross-sectional view taken along the line A1-A1 in FIG. 2A. The gas nozzle 4 is formed in, for example, a columnar shape such as a cylinder or a prism, and a plurality of (four in the example illustrated in FIG. 2A) supply holes 11 for guiding gas are provided along an axial center of the gas nozzle 4.

An end surface 4a, an outer peripheral surface 4b, and an inner peripheral surface 4c of the gas nozzle 4 are exposed to plasma.

Figure 3:
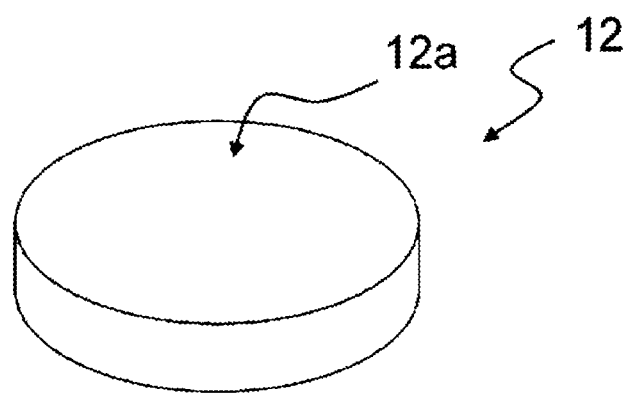
FIG. 3 is a schematic view of a window using a plasma resistant member of the present disclosure.

FIG. 3 is a schematic view of a window using the plasma resistant member of the present disclosure. The window 12 has a first surface 12a and a second surface facing each other, and the first surface 12a is exposed to plasma.

A single crystal yttrium·aluminum·garnet (YAG) has a cubic system crystal structure and has a crystal orientation such as a {100} plane and a {111} plane. The YAG is a material having high plasma resistance, but particularly, the present inventor has found that the {100} plane has excellent plasma resistance by the following experiments.

In order to evaluate the plasma resistance of various members, a reactive ion etching device (RIE device) was used to irradiate a sample with $CF_4$ plasma, and etch depths (etching rates) were compared. It was found that etching depths of alumina ceramics, (100) single crystal YAG, (111) single crystal YAG, and yttrium ceramic are 0.61 µm, 0.16 µm, 0.20 µm, and 0.13 µm, respectively, the plasma resistance of the single crystal YAG is higher than that of the alumina ceramic and comparable to that of the yttrium ceramic, and particularly, the single crystal YAG having a {100} plane has excellent plasma resistance.

Furthermore, since the single crystal YAG has higher strength than the yttrium ceramic, the plasma resistant member of the present disclosure can have both high strength and corrosion resistance.

In the plasma resistant member of the present disclosure, a surface exposed to plasma is formed from a single crystal YAG having a {100} plane.

When the plasma resistant member of the present disclosure is used for the window 12, at least the first surface 12a exposed to plasma is formed from a single crystal YAG having a {100} plane.

Furthermore, in a component such as the gas nozzle 4 having a plurality of surfaces exposed to plasma (the end surface 4a, the outer peripheral surface 4b, and the inner peripheral surface 4c in the gas nozzle 4), at least a surface required to have the highest plasma corrosion resistance among the surfaces exposed to plasma is formed from a single crystal YAG having a {100} plane. For example, in the example illustrated in FIGS. 2A and 2B, the end surface 4a of the gas nozzle 4 is used as a {100} plane. Moreover, as illustrated in FIG. 2A, when the cross-sectional shape of the supply hole 11 is rectangular, the inner circumferential surface 4c may also be used as a {100} plane. Furthermore, when the outer cross-sectional shape of the gas nozzle 4 is rectangular, the outer peripheral surface 4b may also be used as a {100} plane.

In the plasma resistant member of the present disclosure, a surface exposed to plasma is formed from a single crystal YAG. As disclosed in the citation list, corrosion resistance is improved by reducing the porosity and surface roughness of a member. A single crystal has high corrosion resistance because it has smaller and fewer pores (or no pores) as compared to ceramics (polycrystals). Furthermore, in polycrystals, crystal grain boundaries have poor crystallinity and are easily etched as compared to the inside of crystal grains, but since the single crystal has no crystal grain boundaries, the corrosion resistance is high. Furthermore, since there are no crystal grain boundaries and small (few) pores, surface roughness is easily reduced. Furthermore, since there are no crystal grain boundaries and small pores, and few (or no) pores, particles are less likely to be generated. For the above reason, the single crystal YAG is a plasma resistant member having excellent corrosion resistance and less generation of particles.

The crystal surface of the YAG used for the plasma resistant member of the present disclosure may have an offset angle of ±10° or less, particularly preferably ±5° or less from a {100} plane. When the offset angle is 10° or less, plasma resistance comparable to that of the {100} plane can be expected.

Figure 4A:
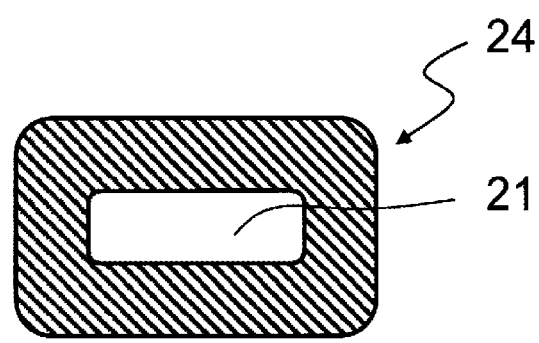
FIG. 4A is another example of a gas nozzle using a plasma resistant member of the present disclosure.

Since the crystal structure of the YAG is a cubic system, the {100} plane has four-fold symmetry, and an equivalent plane appears when rotated by 90° about an axis perpendicular to the plane. Consequently, in a columnar or tubular member such as a gas nozzle, the end surface 4a, which has an axial direction of <100> and is most exposed to plasma, is a {100} plane, and as in the example of FIG. 2A or the example of FIG. 4A, the shape of a cross-section of at least one of an inner peripheral surface (for example, an inner peripheral surface of the supply hole 11 of the gas nozzle 4 or an inner peripheral surface 21 of a gas nozzle 24) or an outer peripheral surface of the member may be rectangular, particularly preferably square, the cross-section being perpendicular to an axis. With such a configuration, since each inner peripheral surface or each outer peripheral surface is an equivalent surface and corrosion resistance and various physical properties of each surface are equal, it is suitable as a corrosion resistant member. For example, deformation due to anisotropy of a thermal expansion rate is less likely to occur.

Figure 4B:
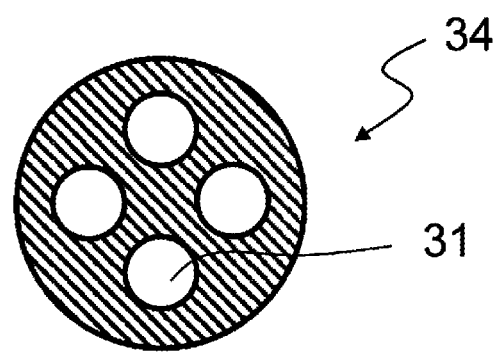
FIG. 4B is another example of a gas nozzle using a plasma resistant member of the present disclosure.

For the same reason, the end surface 4a, which has an axial direction of <100> and is most exposed to plasma, is a {100} plane, and as illustrated in FIG. 4B, when the shape (outer shape, inner shape, and arrangement of a through-hole 31) of a cross-section of a member (gas nozzle 34) has four-fold symmetry, the cross-section being perpendicular to an axis, since various physical properties in the cross-section are relatively isotropic, it is suitable as a corrosion resistant member.

The plasma treatment device component and the plasma treatment device of the present disclosure use the plasma resistant member having the above configuration.

The ingot of the single crystal YAG can be produced by using a Czochralski (CZ) method, for example. A raw material, which is obtained by mixing high-purity (for example, 4N or more) yttria powder and alumina powder, or a polycrystalline YAG, which is obtained by calcining the raw material, is filled in a crucible made of high melting point metal such as iridium, and is heated and melted, and a seed crystal is immersed in a melt and then is pulled up at a predetermined pulling speed and rotation speed, so that a single crystal having a cylindrical straight body can be grown. By appropriately selecting the crystal orientation of the seed crystal, a high-purity (for example, 4N or more) single crystal having a desired crystal orientation can be produced.

A rod-shaped, tubular, or plate-shaped single crystal YAG can be produced by using an edge-defined film-fed growth (EFG) method, for example. A raw material, which is obtained by mixing high-purity (for example, 4N or more) yttria powder and alumina powder, or a polycrystalline YAG, which is obtained by calcining the raw material, is filled in a crucible provided with a mold having a slit and made of high melting point metal such as iridium, and is heated and melted, and a seed crystal is immersed in a melt supplied to an upper surface of the mold via the slit and then is pulled up at a predetermined pulling speed, so that the rod-shaped, tubular, or plate-shaped single crystal can be grown. By appropriately selecting the crystal orientation of the seed crystal, a high-purity (for example, 4N or more) single crystal having a desired crystal orientation can be produced.

The grown ingot is cut to a desired length (thickness) by using various cutting machines such as a wire saw and an outer peripheral blade cutting machine and is processed into a desired shape and surface roughness by using various machining devices such as a machining center and a polishing device, so that a product such as a gas nozzle can be produced.

Reference Signs List

1 Plasma treatment device
2 Reaction chamber
3 Gas supply pipe
4 Gas nozzle
4a End surface
4b Outer peripheral surface
4c Inner peripheral surface
5 Target
6 Holding unit
7 Internal electrode
8 Bias power supply
9 Coil
10 Power supply
11 Supply hole
12 Window
12a First surface

The invention claimed is:

1. A plasma resistant member comprising:
a surface configured for exposure to plasma,
the surface formed from a single crystal yttrium aluminum garnet (YAG) having a {100} plane.

2. The plasma resistant member according to claim 1, wherein
the plasma resistant member has a plate shape, and
a principal plane of the plasma resistant member is formed from the single crystal YAG having the {100} plane.

3. The plasma resistant member according to claim 1, wherein
the plasma resistant member has a columnar shape or a tubular shape, and
at least one of an end surface, an outer peripheral surface, and an inner peripheral surface is formed from the single crystal YAG having the {100} plane.

4. The plasma resistant member according to claim 3, wherein
a longitudinal axis of the plasma resistance member has an axial direction in a <100> direction, and
a shape of a cross-section of at least one of the inner peripheral surface or the outer peripheral surface is rectangular, the cross-section being perpendicular to the axis.

5. The plasma resistant member according to claim 3, wherein
a longitudinal axis of the plasma resistance member has an axial direction in a <100> direction, and
a shape of a cross-section perpendicular to the axis has four-fold symmetry.

6. The plasma resistant member according to claim 3, wherein
an axial direction is a direction of a longitudinal axis of the plasma resistant member, and
a shape of a cross-section of at least one of the inner peripheral surface or the outer peripheral surface is rectangular, the cross-section being perpendicular to the axis.

7. The plasma resistant member according to claim 3, wherein
an axial direction is a direction of a longitudinal axis of the plasma resistant member, and
a shape of a cross-section perpendicular to the axis has four-fold symmetry.

8. A plasma treatment device component comprising:
the plasma resistant member according to claim 1.

9. A plasma treatment device comprising:
the plasma resistant member according to claim 1.

10. A plasma resistant member comprising:
a plurality of surfaces for exposure to plasma,
at least one surface of the plurality of surfaces having a highest plasma resistance, the at least one surface formed from a single crystal yttrium aluminum garnet (YAG) having a {100} plane.

11. The plasma resistant member according to claim 10, wherein
the plasma resistant member has a plate shape, and
a principal plane of the plasma resistant member is formed from the single crystal YAG having the {100} plane.

12. The plasma resistant member according to claim 10, wherein
the plasma resistant member has a columnar shape or a tubular shape, and
at least one of an end surface, an outer peripheral surface, and an inner peripheral surface is formed from the single crystal YAG having the {100} plane.

13. The plasma resistant member according to claim 12, wherein
a longitudinal axis of the plasma resistance member has an axial direction in a <100> direction, and
a shape of a cross-section of at least one of the inner peripheral surface or the outer peripheral surface is rectangular, the cross-section being perpendicular to the axis.

14. The plasma resistant member according to claim 12, wherein
a longitudinal axis of the plasma resistance member has an axial direction in a <100> direction, and
a shape of a cross-section perpendicular to the axis has four-fold symmetry.

15. The plasma resistant member according to claim 12, wherein
an axial direction is a direction of a longitudinal axis of the plasma resistant member, and
a shape of a cross-section of at least one of the inner peripheral surface or the outer peripheral surface is rectangular, the cross-section being perpendicular to the axis.

16. The plasma resistant member according to claim 12, wherein
an axial direction is a direction of a longitudinal axis of the plasma resistant member, and
a shape of a cross-section perpendicular to the axis has four-fold symmetry.

17. A plasma treatment device component comprising:
the plasma resistant member according to claim 10.

18. A plasma treatment device comprising:
the plasma resistant member according to claim 10.

* * * * *